United States Patent
Liu et al.

(10) Patent No.: US 9,252,159 B2
(45) Date of Patent: Feb. 2, 2016

(54) ARRAY SUBSTRATE AND FABRICATION METHOD THEREOF, AND DISPLAY DEVICE

(71) Applicants: BOE Technology Group Co., Ltd., Beijing (CN); Beijing BOE Display Technology Co., Ltd., Beijing (CN)

(72) Inventors: Jiarong Liu, Beijing (CN); Zhixiao Yao, Beijing (CN); Hongtao Lin, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/081,639

(22) Filed: Nov. 15, 2013

(65) Prior Publication Data

US 2014/0138718 A1    May 22, 2014

(30) Foreign Application Priority Data

Nov. 16, 2012  (CN) .......................... 2012 1 0466167

(51) Int. Cl.
*H01L 29/18* (2006.01)
*H01L 27/12* (2006.01)
*G02F 1/1343* (2006.01)

(52) U.S. Cl.
CPC ........ *H01L 27/124* (2013.01); *G02F 1/134363* (2013.01); *H01L 27/1259* (2013.01); *G02F 2001/134372* (2013.01)

(58) Field of Classification Search
CPC .......................... H01L 27/124; H01L 27/1259
See application file for complete search history.

(56) References Cited

U.S. PATENT DOCUMENTS

| 2004/0174468 | A1  |  9/2004 | Yang et al. |
| 2005/0218819 | A1* | 10/2005 | Eida .......................... 315/169.3 |
| 2006/0290863 | A1* | 12/2006 | HoeSup ....................... 349/141 |
| 2007/0065971 | A1* |  3/2007 | Son .............................. 438/74 |
| 2008/0225196 | A1* |  9/2008 | Kim .............................. 349/54 |
| 2008/0284967 | A1* | 11/2008 | Oh et al. ...................... 349/144 |

(Continued)

FOREIGN PATENT DOCUMENTS

| CN | 101373301 A |   | 2/2009 |
| CN | 101520580 A |   | 9/2009 |
| CN | 101738799 A |   | 6/2010 |
| CN | 202888180 U |   | 4/2013 |
| JP | 2010-2596   | * | 1/2010 |

OTHER PUBLICATIONS

First Office Action and Search Report issued by Chinese Patent Office for priority application 201210466167.8 dated Aug. 7, 2014 with English translation.

*Primary Examiner* — A. Sefer
(74) *Attorney, Agent, or Firm* — Frommer Lawrence & Haug LLP

(57) ABSTRACT

The present invention discloses an array substrate comprising a plurality of common electrode lines, a plurality of gate lines, and a plurality of data lines formed on a substrate, and a plurality of pixel units formed among the gate lines, the data lines and the common electrode lines, each pixel unit comprises: a pixel electrode, a first TFT, and a common electrode, the gate line and the data line drive the pixel electrode through the first TFT, the common electrode line is connected to the common electrode, the common electrode line and the data line do not overlap with each other, and an insulating layer is disposed between the common electrode line and the date line. The present invention further discloses a fabrication method of the array substrate and a display device comprising the array substrate.

12 Claims, 4 Drawing Sheets

(56) References Cited

U.S. PATENT DOCUMENTS

2009/0310048 A1* 12/2009 Shin et al. .................... 349/38
2011/0281386 A1* 11/2011 Lim et al. .................... 438/34
2012/0099041 A1* 4/2012 Xie et al. .................... 349/42
2012/0305947 A1* 12/2012 Lee .................... 257/88

* cited by examiner

ARRAY SUBSTRATE AND FABRICATION METHOD THEREOF, AND DISPLAY DEVICE

FIELD OF THE INVENTION

The present invention relates to the field of display technologies, more particularly, to an array substrate and a fabrication method thereof, and a display device.

BACKGROUND OF THE INVENTION

In traditional Fringe Field Switching (FFS) mode and Advanced super Dimension Switch (ADS) mode display technologies, a common electrode line and a gate line are simultaneously deposited on a TFT substrate by using a same material, the common electrode line and the gate line are parallel to each other and the common electrode line (and the gate line) overlaps with a data line. Therefore, parasitic capacitance is generated between the data line and the common electrode line.

The common electrode line supplies a DC voltage to a common electrode of each pixel, and as the common electrode line is influenced by the parasitic capacitance, greenish picture problem will occurs, thereby compromising the display effect. Under the FFS or ADS mode, this problem gets worse as the size of a panel is larger.

SUMMARY OF THE INVENTION (1) Technical Problem to be Solved

An objective of the present invention is to mitigate or eliminate the greenish picture phenomenon of a FFS or ADS mode display panel.

To solve the above objective, the present invention provides an array substrate, including a plurality of common electrode lines, a plurality of gate lines and a plurality of data lines formed on a substrate, and a plurality of pixel units formed among the gate lines, the data lines and the common electrode lines. Each pixel element includes a pixel electrode, a first thin film transistor (TFT) and a common electrode. The gate of the first TFT is connected to the gate line, the source of the first TFT is connected to the data line, the drain of the first TFT is connected to the pixel electrode, and the common electrode line is connected to the common electrode. The common electrode line and the data line do not overlap with each other.

Preferably, the pixel unit may further include a second TFT for connecting the common electrode line to the common electrode. The gate of the second TFT is connected to the gate line, the source of the second TFT is connected to the common electrode line, and the drain of the second TFT is connected to the common electrode.

Preferably, the common electrode line may be parallel to the data line.

Preferably, an insulating layer may be disposed between the common electrode line and the gate line, and between the data line and the gate line.

Preferably, the common electrode line and the data line may be disposed at a same level.

The present invention further provides a fabrication method of an array substrate, including the following steps: forming a gate line, a first gate and a gate insulating layer on a substrate, and connecting the first gate to the gate line; forming a first active layer; forming a first source, a first drain, a data line and a common electrode line not overlapping with the data line, and connecting the first source to the data line; and forming a common electrode, a pixel electrode and a passivation layer between the common electrode and the pixel electrode, connecting the common electrode to the common electrode line, and connecting the pixel electrode to the first drain.

Preferably, forming the passivation layer on the common electrode, and forming the pixel electrode on the passivation layer, forming a via passing through the passivation layer and connecting the pixel electrode to the first drain through the via.

Preferably, a second gate may be formed at the same time as forming the first gate and connected to the gate line. A second active layer may be formed at the same time as forming the first active layer. A second source and a second drain may be formed at the same time as forming the first source, the first drain, the data line and the common electrode line, and the second source is connected to the common electrode line. The common electrode may be formed after forming the second source and the second drain and connected to the second drain.

Alternatively, forming the passivation layer on the pixel electrode, and forming the common electrode on the passivation layer.

Preferably, a second gate may be formed at the same time as forming the first gate and connected to the gate line. A second active layer may be formed at the same time as forming the first active layer. A second source and a second drain may be formed at the same time as forming the first source, the first drain, the data line and the common electrode lane, and the second source is connected to the common electrode line. A via hole may be formed after forming the passivation layer and the common electrode s connected to the second drain through the via.

Preferably, the common electrode line is parallel to the data line.

The present invention further provides a display device including the array substrate according to the present invention.

(3) Beneficial Effects

The common electrode line and the data line may be designed not to overlap each other according to the array substrate of the present invention, and therefore no parasitic capacitance will be generated between the common electrode line and the data line, overcoming the greenish picture phenomenon caused by the parasitic capacitance.

DETAILED DESCRIPTION OF EMBODIMENTS

In the following, specific implementations of the present invention will be described in detail with reference to the drawings and embodiments. The below embodiments are illustrative only and are not used to limit the scope of the present invention.

Figure 1:
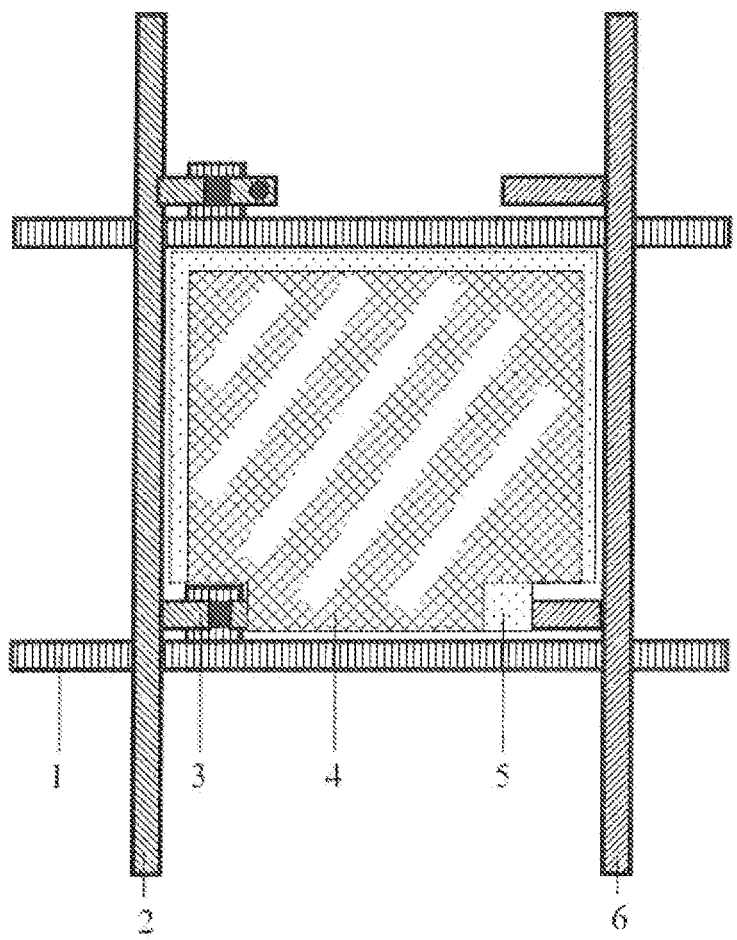
FIG. 1 is a schematic diagram of a structure of an gray substrate according to an embodiment of the present invention.

FIG. 1 is a schematic diagram of a structure of an array substrate according to an embodiment of the present invention.

As illustrated in FIG. 1, the array substrate of the embodiment includes: a gate line 1, a data line 2, a common electrode line 6 and a pixel unit formed among the gate line 1, the data line 2 and the common electrode line 6. The pixel unit includes: a Thin Film Transistor (TFT) 3, a pixel electrode 4 and a common electrode 5. The gate of the TFT 3 is connected to the gate line 1, the source and the drain of the first TFT 3 are connected to the data line 2 and the pixel electrode 4, respectively. An insulating layer normally a passivation layer) is disposed between the common electrode 5 and the pixel electrode 4. To mitigate greenish picture phenomenon caused by parasitic capacitance between the common electrode line 6 and the data line 2, the common electrode line 6 and the data line 2 are configured not to overlap with each other, according to the array substrate of the embodiment. Preferably, the common electrode line 6 is formed parallel to the data line 2, so as to avoid the formation of the parasitic capacitance between the common electrode line 6 and the data line 2. The common electrode line 6 may be connected to the common electrode 5 directly and a gate insulating layer is disposed between the common electrode line 6 and the gate line 1, and between the data line 2 and the gate line 1.

Figure 2:
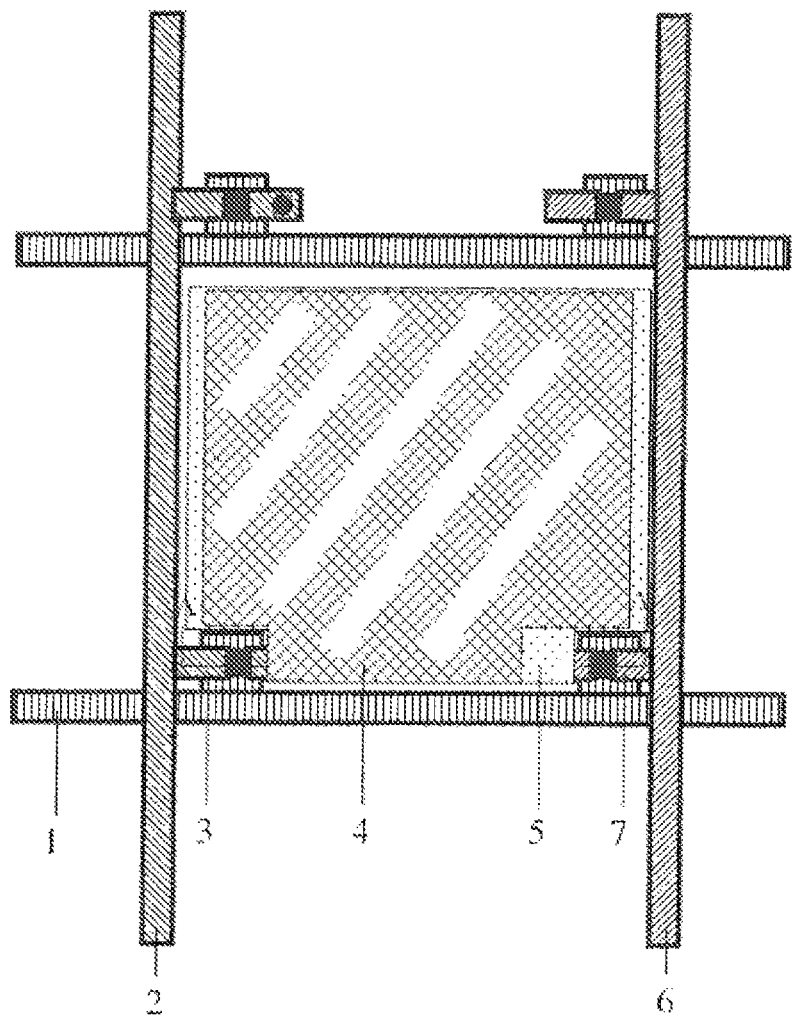
FIG. 2 is a schematic diagram of a structure of an array substrate ac according to another embodiment of the present invention.
Figure 3:
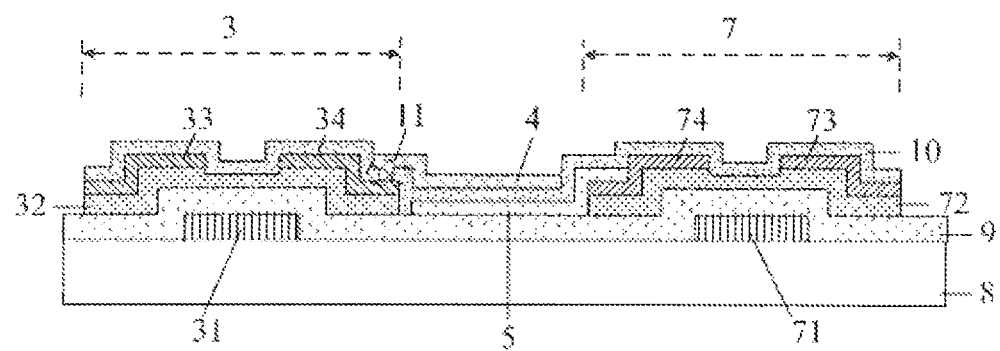
FIG. 3 is a cross-sectional view taken along line A-A of FIG. 2.

FIG. 2 is a schematic diagram of a structure of an array substrate according to another embodiment of the present invention, FIG. 3 is a cross-sectional view taken along line A-A of FIG. 2.

In comparison with the embodiment illustrated in FIG. 1, in the embodiment illustrated in FIGS. 2 and 3, the common electrode line 6 and the common electrode 5 are not directly connected, but instead, a TFT 7 is disposed between the common electrode line 6 and the common electrode 5.

In the embodiment illustrated in FIG. 1 as the common electrode line 6 and the gate line 1 overlap with each other, parasitic capacitance may still be generated between the common electrode line 6 and the gate line 1. Though parasitic capacitance may be generated between the common electrode line 6 and the gate line 1, as the gate lines are generally scanned line by line, a voltage is not applied to all gate lines at the same time. Therefore, the greenish picture phenomenon will be alleviated. However, to further reduce the influence of the parasitic capacitance generated between the common electrode line 6 and the gate line 1 on the display effect, the following embodiment is proposed.

According to this embodiment, a TFT 7 is disposed between the common electrode line 6 and the common electrode 5. As illustrated in FIGS. 2 and 3, the TFT 7 includes a gate 71, an active layer 72, a source 73 and a drain 74. The gate 71 of the TFT 7 is connected to the gate line 1, the source 73 is connected to the common electrode line 6, and the drain 74 is connected to the common electrode 5.

In a case where there is no TFT 7, the common electrode 5 and the common electrode line 6 of the pixel unit are directly connected. When the gate line 1 of a current row is not selected while other gate lines 1 are selected one by one, signal stability of the common electrode line 6 may be affected due to the parasitic capacitances existing between the individual gate lines and the common electrode line 6, which in turn affect the voltage of the common electrode 5 of the current row directly connected to the common electrode line 6. According to this embodiment, when the gate line 1 of the current row is not selected, the TFTs 7 of the current row are OFF, and therefore, coupling effect between the other gate lines and the common electrode line 6 will not directly act on the common electrode 5 of the current row, thereby reducing the influence on the display effect.

According to an embodiment of the present invention, the common electrode line 6 and the data line 2 may be disposed at a same level, that is, the common electrode line 6 and the data line 2 may be formed with a same material through a single patterning process at the same time.

FIGS. 4 to 7 are schematic diagrams illustrating a fabrication method of an array substrate according to an embodiment of the present invention.

According to the embodiment of the present invention, the method for fabricating the array substrate includes:

forming a gate line, a first gate and a gate insulating layer on a substrate, and connecting the first gate to the gate line;

forming a first active layer;

forming a first source, a first drain, a data line and a common electrode line not overlapping with the data line, and connecting the first source to the data line;

forming a common electrode, a pixel electrode and a passivation layer between the common electrode and the pixel electrode, connecting the common electrode to the common electrode line, and connecting the pixel electrode to the first drain.

The passivation layer may be formed on the common electrode and the pixel electrode may be forming on the passivation layer. In this case, a via passing through the passivation layer is formed and the pixel electrode is connected to the first drain through the via.

Furthermore, a second gate may be formed at the same time as forming the first gate and is connected to the gate line. A second active layer may be formed at the same time as forming the first active layer. A second source and a second drain may be formed at the same time as forming the first source, the first drain, the data line and the common electrode line, and the second source is connected to the common electrode line. The common electrode may be formed after forming the second source and the second drain, and is connected to the second drain.

Furthermore, the common electrode line may be formed parallel to the data line.

In the following, fabrication procedures for fabricating the array substrate as illustrated in FIGS. 2 and 3 will be described in detail with reference to FIGS. 4 to 7.

Figure 4:
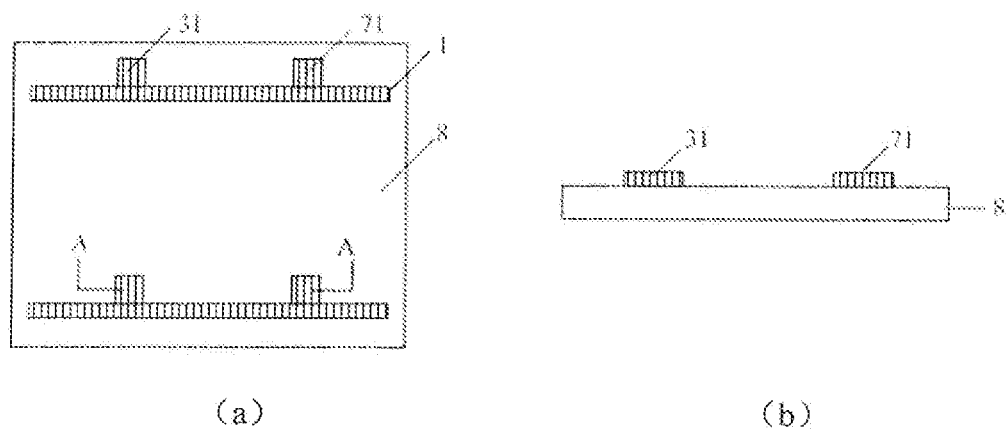
FIGS. 4 to 7 are schematic diagrams illustrating a fabrication method of an array substrate according to an embodiment of the present invention, wherein (a) is a plan view, (b) is a cross-sectional view along line A-A.
Figure 5:
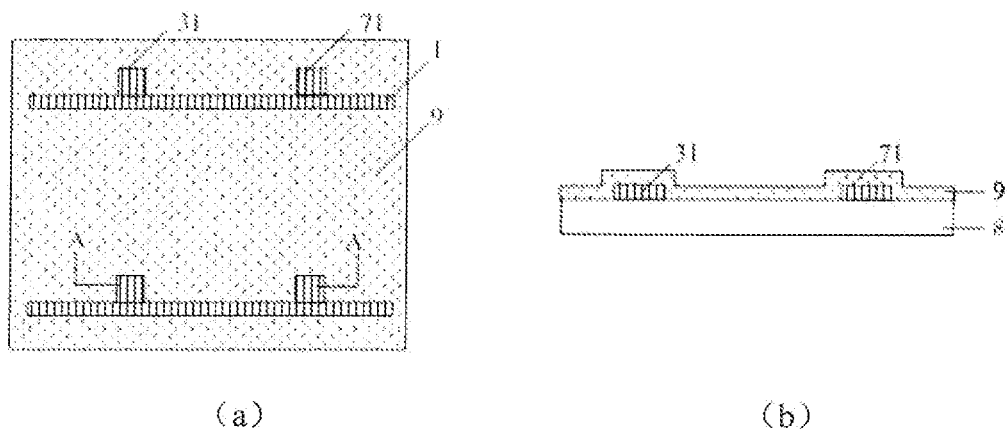

With reference to FIGS. 4 and 5, a gate line 1, a first gate 31, and a second gate 71 are formed on a substrate, and a gate insulating layer 9 is also formed.

As illustrated in FIG. 4, a gate metal film is deposited on the substrate 8, and then the gate line 1, the first gate 31 and the second gate 71 are formed through a patterning process. The substrate 8 is generally a glass substrate. Furthermore, the gate metal film may also be formed in many ways such as coating, sputtering. The patterning process generally including processes such as photoresist application, exposure, developing, etching, and photoresist removal.

As illustrated in FIG. 5, a gate insulating film is deposited to form a gate insulating layer 9 after forming the gate line 1 the first gate 31 and the second gate 71.

Figure 6:
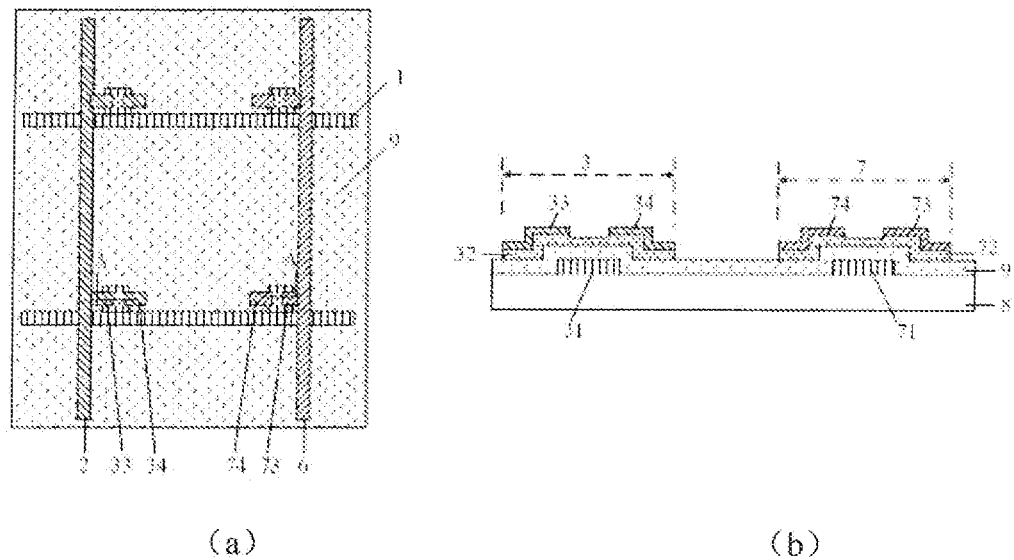
Figure 7:
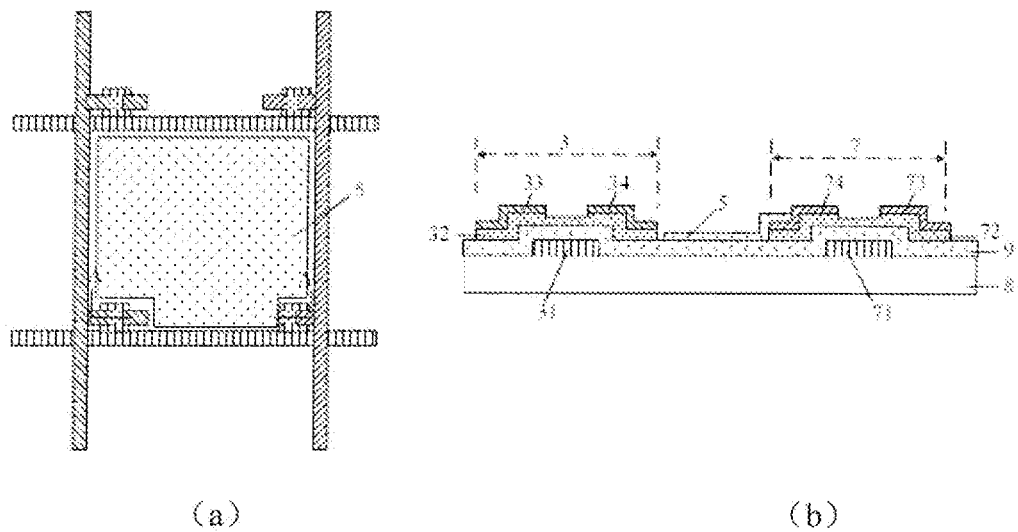

With reference to FIGS. 6 and 7, a first active layer 32, a second active layer 72, a first source 33, a first drain 34, a second source 73, a second drain 74, a data line 2, a common electrode line 6 and a common electrode 5 are formed, and the common electrode line 6 and the data line 2 do not overlap with each other. Preferably, the common electrode line 6 is formed as being parallel to the data line 2.

As illustrated in FIG. 6, a semiconductor film is deposited on the substrate with the gate insulating layer 9 formed thereon, and then the first active layer 32 and the second active layer 72 are formed through a patterning process.

A source and drain metal film is deposited on the substrate with the first active layer 32 and the second active layer 72 formed thereon, and then the first source 33, the first drain 34, the data line 2, the second source 73, the second drain 74, and the common electrode line 6 are formed through a patterning process. The first active layer 32, the first source 33, the first drain 34, the data line 2, the second active layer 72, the second source 73, the second drain 74 and the common electrode line 6 may also be formed through a single patterning process by using a gray-tone or a half-tone mask. The second source 73 is connected to the common electrode line 6. To prevent the common electrode line 6 from overlapping with the data line 2, the common electrode line 6 is formed as being parallel to the data line 2 according to this embodiment.

As illustrated in FIG. 7, a transparent conductive film (such as an ITO film) is deposited on the structure as illustrated in FIG. 6, then a pattern of a common electrode 5 is formed through a patterning process, and the common electrode 5 is connected to the second drain 74.

Referring to FIGS. 2 and 3 again, an insulating film is deposited on the structure shown in FIG. 7 to form a passivation layer 10, and a via 11 passing through the passivation layer 10 is formed to expose a part of the first drain 34. A transparent conductive film (such as an ITO film) is deposited, and a pixel electrode 4 is formed through a patterning process.

Furthermore, according to another embodiment of the present invention, the passivation layer may be formed on the pixel electrode and the common electrode may be forming on the passivation layer.

Furthermore, a second gate may be formed at the same time as forming the first gate and is connected to the gate line. A second active layer may be formed at the same time as forming the first active layer. A second source and a second drain may be formed at the same time as forming the first source, the first drain, the data line and the common electrode line, and the second source is connected to the common electrode line. A via may be formed after forming the passivation layer, and the common electrode may be connected to the second drain through the via.

The only difference between the methods for fabricating an array substrate according to this and the previous embodiments is that the pixel electrode 4 is formed earlier, and then the passivation layer 10 and the common electrode 5 on the passivation layer 10 are formed. Therefore, descriptions for the same parts are omitted. This embodiment has the advantage of saving process steps, as in a case where forming the second TFT is not required, no need to form the via.

The array substrate according to the present invention may be applied to various display devices such as a liquid crystal panel, an E-paper, a liquid crystal television, a liquid crystal display, a digital photo-frame, a mobile phone, a tablet PC and any other product or device having a display function.

Moreover, the inventive concept is described in detail by only taking a bottom-gate TFT as an example. However, the inventive concept is not limited thereto, and also applies to a top-gate TFT as well.

A display device using the array substrate according to the present invention may significantly improve the greenish picture phenomenon to improve the display effect.

The above embodiments are used to explain but not limit the present invention. Various modifications and variations can be made by the person skilled in the art without departing from the spirit and scope of the present invention. As such, all equivalent technical solutions are within the scope of the present invention, and the protection scope of the present invention should be defined by the claims.

The invention claimed is:

1. An array substrate, comprising a plurality of common electrode lines, a plurality of gate lines and a plurality of data lines formed on a substrate, and a plurality of pixel units formed among the gate lines, the data lines and the common electrode lines, wherein each pixel unit comprises:
    a pixel electrode;
    a first TFT; and
    a common electrode;
    wherein, gate of the first TFT is connected to the gate line, source of the first TFT is connected to the data line, drain of the first TFT is connected to the pixel electrode, and the common electrode line is connected to the common electrode,
    wherein, the common electrode line and the data line do not overlap with each other,
    wherein the pixel electrode and the common electrode are implemented in different layers and overlapped with each other,
    wherein the pixel unit further comprises a second TFT for connecting the common electrode line to the common electrode,
    wherein, gate of the second TFT is connected to the gate line, source of the second TFT is connected to the common electrode line, and drain of the second TFT is connected to the common electrode.

2. The array substrate of any of claim 1, wherein, the common electrode line is parallel to the data line.

3. The array substrate of any of claim 1, wherein, an insulating layer is disposed between the common electrode line and the gate line, and between the data line and the gate line.

4. The array substrate of any of claim 1, wherein, the common electrode line and the data line are disposed at a same level.

5. A display device, comprising the array substrate of claim 1.

6. The display device of claim 5, wherein, the common electrode line is parallel to the data line.

7. The display device of claim 5, wherein, an insulating layer is disposed between the common electrode line and the gate line, and between the data line and the gate line.

8. The display device of claim 5, wherein, the common electrode line and the data line are disposed at a same level.

9. A fabrication method of an array substrate, comprising the following steps:
    forming a gate line, a first gate and a gate insulating layer on a substrate, and connecting the first gate to the gate line;
    forming a first active layer;
    forming a first source, a first drain, a data line and a common electrode line which is not overlapping with the data line, and connecting the first source to the data line; and
    forming a common electrode, a pixel electrode and a passivation layer between the common electrode and the pixel electrode, connecting the common electrode to the common electrode line, and connecting the pixel electrode to the first drain,
    wherein the pixel electrode and the common electrode are implemented in different layers and overlapped with each other,
    wherein, forming the passivation layer on the common electrode, and forming the pixel electrode on the passivation layer, forming a via passing through the passivation layer and connecting the pixel electrode to the first drain through the via, and wherein, forming a second gate at the same time as forming the first gate and connecting the second gate to the gate line;

forming a second active layer at the same time as forming the first active layer;

forming a second source and a second drain at the same time as forming the first source, the first drain, the data line and the common electrode line, and connecting the second source to the common electrode line;

forming the common electrode after forming the second source and the second drain, and connecting the common electrode to the second drain.

10. The method of claim 9, wherein the common electrode line is parallel to the data line.

11. A fabrication method of an array substrate, comprising the following steps:

forming a gate line, a first gate and a gate insulating layer on a substrate, and connecting the first gate to the gate line;

forming a first active layer;

forming a first source, a first drain, a data line and a common electrode line which is not overlapping with the data line, and connecting the first source to the data line; and forming a common electrode, a pixel electrode and a passivation layer between the common electrode and the pixel electrode, connecting the common electrode to the common electrode line, and connecting the pixel electrode to the first drain, wherein the pixel electrode and the common electrode are implemented in different layers and overlapped with each other, wherein, forming the passivation layer on the pixel electrode, and forming the common electrode on the passivation layer, and wherein, forming a second gate at the same time as forming the first gate and connecting the second gate to the gate line;

forming a second active layer at the same time as forming the first active layer;

forming a second source and a second drain at the same time as forming the first source, the first drain, the data line and the common electrode line, and connecting the second source to the common electrode line;

forming a via after forming the passivation layer, and connecting the common electrode to the second drain through the via.

12. The method of claim 11, wherein the common electrode line is parallel to the data line.

* * * * *